US006263913B1

(12) United States Patent
Kussel

(10) Patent No.: US 6,263,913 B1
(45) Date of Patent: Jul. 24, 2001

(54) HYDRAULIC MULTIWAY VALVE

(75) Inventor: Willy Kussel, Werne (DE)

(73) Assignee: Tiefenbach Bergbautechnik GmbH, Essen (DE)

( * ) Notice: Subject to any disclaimer, the term of this patent is extended or adjusted under 35 U.S.C. 154(b) by 0 days.

(21) Appl. No.: 09/555,196

(22) PCT Filed: Sep. 14, 1999

(86) PCT No.: PCT/EP99/06807

§ 371 Date: Aug. 8, 2000

§ 102(e) Date: Aug. 8, 2000

(87) PCT Pub. No.: WO00/18382

PCT Pub. Date: Apr. 6, 2000

(30) Foreign Application Priority Data

Sep. 28, 1998 (DE) .............................................. 198 44 184

(51) Int. Cl.[7] .......................... F15B 13/044; F16K 31/02; F16K 11/16; F16K 37/00; G01R 31/00

(52) U.S. Cl. ................. 137/551; 137/596.17; 137/627.5; 73/168; 324/418

(58) Field of Search .............................. 137/551, 596.17, 137/596.2, 625.65, 627.5; 73/168; 324/418, 546; 318/686, 687; 340/644, 686.1

(56) References Cited

U.S. PATENT DOCUMENTS 4,870,364 * 9/1989 Trox et al. .
5,182,517 * 1/1993 Thelen et al. ......................... 324/418
5,417,241 * 5/1995 Tischer et al. .................... 137/596.2
5,469,825 * 11/1995 Golab et al. .
5,490,031 * 2/1996 Braun et al. .
5,492,009 * 2/1996 Kempf et al. ......................... 137/551

FOREIGN PATENT DOCUMENTS

374258 * 2/1964 (CH) .
196 41 244 A1 * 4/1998 (DE) .
955 424 * 1/1950 (FR) .
1 308 532 * 2/1963 (FR) .
2 056 622 * 3/1981 (GB) .
2 156 044 * 10/1985 (GB) .

* cited by examiner

*Primary Examiner*—Michael Powell Buiz
*Assistant Examiner*—Ramesh Krishnamurthy
(74) *Attorney, Agent, or Firm*—Alston & Bird LLP

(57) ABSTRACT

The hydraulic multiway valve comprises a control piston (main piston 3), which is displaceable against the force of a spring (main spring 18) by the plunger of a magnet (12) from its first position (closing position) to its second position (opening position). In the closing position, a pressure chamber (7) with a pump connection (P) is closed toward a consumer chamber (8), and the consumer chamber with a consumer (A) is opened toward a return flow chamber (20) and a reservoir connection (R). In the opening position, the consumer chamber (8) is closed toward the return flow chamber (20). To this end, the consumer chamber (8) and the return flow chamber (20) are arranged at the opposite ends of the main piston (3), namely the consumer chamber (8) on the side facing the magnet, and the return flow chamber (20) on the side facing away therefrom. A central channel (21) extends through the main piston. The central channel interconnects the consumer chamber (8) and the return flow chamber (20). A magnet plunger acts upon a plunger piston, which is displaceable in the valve housing in coaxial relationship with the main piston, and which comprises a seat end facing the main piston (3), through which it closes the central channel, when it contacts the main piston. A power control unit recognizes errors in the operation of the magnet and the valve, and further insures that adequate holding forces act upon the main piston and power use to operate the valve is minimized.

16 Claims, 2 Drawing Sheets

HYDRAULIC MULTIWAY VALVE

BACKGROUND OF THE INVENTION

The present invention relates to a type of generally known hydraulic multiway valve having a control piston (main piston) that is displaceable against the force of a spring (main spring), by the plunger of a magnet, from its first position (closing position) to its second position (opening position).

In the case of this known valve, a pressure chamber, in which a pump connection terminates, is closed in the one position of the valve piston (closing position), and a consumer chamber with a consumer are opened toward a return flow chamber and a reservoir connection, so that the consumer is relieved from pressure. In the opening position, the consumer connects to the pump connection, and the pressure chamber is closed toward the return flow chamber and the reservoir.

This valve is especially suitable as a servovalve for a hydraulic valve, which is hydraulically operated.

It is an object of the present invention to improve this known valve such that it is suited for a servovalve with a small overall size, and so that is has a positive cover with respect to closing the consumer chamber toward the return flow and opening the consumer chamber toward the pressure chamber.

SUMMARY OF THE INVENTION

The above and other objects are of the present invention are provided by a hydraulic multiway valve that includes a housing defining a consumer chamber, a return flow chamber, and pressure chamber positioned between the consumer chamber and the return flow chamber. The housing further defines a pump channel open to the pressure chamber, a consumer channel open to the consumer chamber, and a reservoir channel for being opened to the return flow chamber. A main piston is moveably positioned in the housing. The main piston has opposite ends arranged so that the consumer chamber and the return flow chamber are arranged at the opposite ends of the main piston. The main piston defines a central channel that extends through the main piston and is open at the opposite ends of the main piston, so that the consumer chamber and the return flow chamber are capable of being opened to one another via the central channel while the central is open. A spring biases the main piston toward a closed position in which the pressure chamber is closed to the consumer chamber. A plunger piston is positioned in the valve housing for coaxial movement relative to the main piston. The plunger piston is moveable toward the main piston so that a seat end of the plunger piston engages a predetermined one of the ends of the main piston to close the central channel. The plunger piston is moveable away from the main piston to an open position in which the central channel is open. A magnet assembly moves the plunger piston so that the seat end thereof moves into contact with the predetermined end of the main piston to close the central channel. Thereafter, the magnet assembly further moves the plunger piston so that the force of the spring associated with the main piston is overcome so that the main piston is moved to an open position. In the open position of the main piston of the pressure chamber is open to the consumer chamber.

The above-described valve of the present invention has the advantage that the valve housing need not provide connections between the return flow channel and the consumer channel. Consequently, the valve can be accommodated in particular in a valve cartridge. This provides for easy adjusting of the cover and the opening width of the connection between the consumer and the return flow, so that it is possible to adjust in this way the damping of the motion of the main valve.

To avoid that the hydraulic forces are inadequate to raise the plunger piston with certainty from the main piston and to establish the return flow connection between the consumer connection (control connection of the main valve) and the return flow, a safety spring pushes the plunger piston against the force of the magnet assembly to its opening position in such a manner that the center channel is opened in the closing position of the main piston.

In accordance with one aspect of the present invention, the valve housing has a seat that is in the shape of an inner cone. Similarly, the main piston has a flange that is in the shape of an outer cone and that engages the seat of the valve housing while the main piston is in its closed position, so that the pump channel and the pressure chamber are closed with respect to the consumer chamber and the consumer channel. This aspect provides for a reliable, leakproof closure between the pressure chamber and the consumer chamber.

In accordance with one aspect of the present invention, the housing is an inner housing and the hydraulic multiway valve further comprises an outer housing having a front side that mounts the magnet assembly. The inner housing is removably positioned in the outer housing and oriented so that the consumer chamber is proximate the front side of the outer housing. Most preferably, the inner housing is screwably engaged to the outer housing. The plunger piston contacts either the outer housing or a portion of the magnet assembly while the plunger position is in its opened position. The manufacturing advantages of this aspect combine with a satisfactory possibility of adjusting the cover and the opening width of the connection between the consumer and the return flow.

Preferably, the closing end of the main piston, which extends into the consumer chamber, and the seat end of the plunger piston are designed and constructed as a pairing of cones.

The spring and the seating surfaces of the valve housing and the main piston are advantageously constructed so that the pressure chamber can be tightly closed toward the consumer chamber and the control connection. Hydraulic multiway valves, which are used as servovalves, and which are electromagnetically controlled, must offer a high safety standard in many fields of application (for example, in the case of lifting apparatus or in mining).

The construction and further development of an electro-hydraulic multiway valve according to another aspect of the present invention has the advantage that errors of the magnet assembly or the valve are recognized immediately and with foresight. To this end, a power control unit is integrated in the activation device of the magnet. The power control unit is preferably located on or in the region of the magnet. The power control unit possesses an electronic memory. The memory stores characteristic values, which characterize in the ideal case the power input of the magnet in the course of switching, when it connects to one of the switch positions. The actual flow of the current taken by the magnet is measured, when the valve is switched to the switch position, and/or when the magnet is disconnected, and at least prominent points of the actual flow or the entire actual flow are compared with the corresponding points of the desired flow or with the desired flow and predetermined deviations are signaled. The signaling of the error message occurs on the valve itself, in particular by an optical signal.

In accordance with one aspect of the present invention, the power control unit functions such that not each deviation is signaled. Rather, it is determined first by test which deviations are within the scope of acceptable operational tolerances.

It is essential for the operation of a servovalve that on the one hand adequate holding forces act upon the valve piston for purposes of positioning the piston safely in its approached switch position. On the other hand, however, it is intended to minimize power consumption. In the case of an electrohydraulic servovalve or multiway valve and in accordance with one aspect of the present invention, this is accomplished through operation of the power control unit. More specifically, the power control unit measures the current flow of the magnet during the switching operation and determines the reaching of the switch position. After a drop of the current at the end of the switching operation, the current is one more time increased substantially to the greatest extent traversed during the switching operation, and subsequently decreased to the extent necessary for holding the switch position. In the case of this construction, this also occurs in multiway valves, which are provided with a plurality of successive switching stages in the contact travel. With that, it is realized on the one hand that the valve piston reaches its switch position safely and with an adequate holding force. On the other hand, however, it is avoided that the magnet is energized until saturation and thereby charged beyond the necessary extent, in particular heated. The power consumption and in particular also the current peaks are limited to the necessary extent.

BRIEF DESCRIPTION OF THE DRAWINGS

In the following, embodiments of the invention are described with reference to the drawings, in which.

DETAILED DESCRIPTION OF EMBODIMENTS OF THE INVENTION

Figure 1:
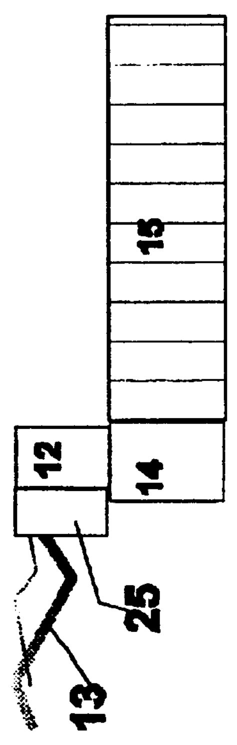
FIG. 1 illustrates a hydraulically controlled multiway valve, which is actuated by an electrohydraulic three-way servovalve.
Figure 2:
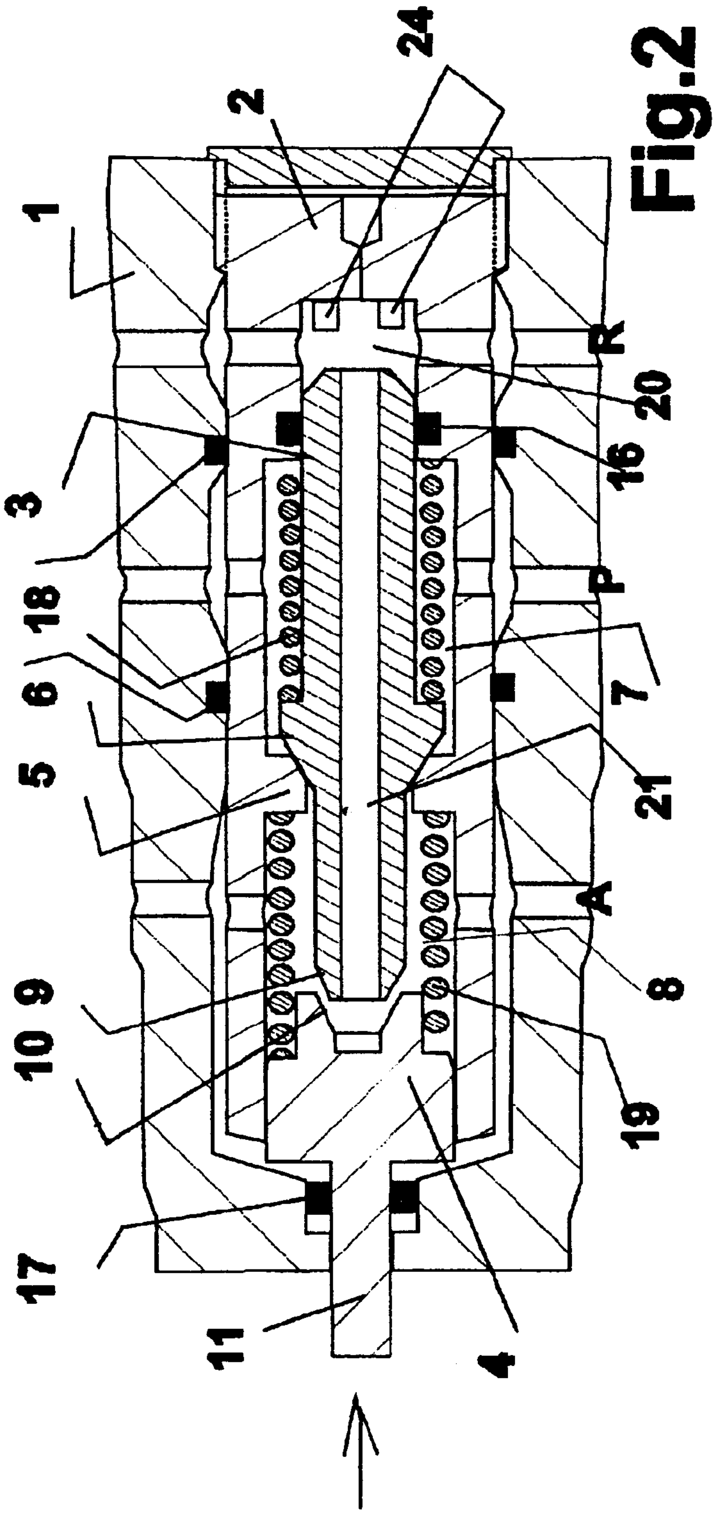
FIG. 2 shows the electrohydraulic servovalve.

The main valve, an electrohydraulic control valve 15, includes an electromagnetically activated servovalve. The servovalve comprises a valve housing (outer housing 1), which can be installed in a valve body (servovalve 14 shown only in FIG. 1). A substantially hollow cylindrical valve housing can be screwed by means of a screw thread into the outer housing 1, and is sealable in zones by outer gaskets 22 and 23. In a cartridge 2, the main piston, valve piston 3, is arranged for sliding movement at one end, and sealed toward an end space of the cartridge by means of a gasket 16. The end space forms a return flow chamber 20, which connects to a return flow channel R of the valve that leads to a reservoir.

In the front side of the outer housing 1, which faces away from the return flow chamber 20, a plunger piston 4 is arranged for sliding movement, and sealed toward the outside by a gasket 17. The plunger piston 4 extends into a control chamber 8, which is formed in this region of the outer casing 1 and in the cartridge 2. The control chamber 8 is closed toward a pump connection chamber 7 by an inner shoulder, which forms a seat 5. In the region of the seat 5, the main piston 3 possesses a seat flange 6, which cooperates with the seat 5 of the cartridge, and forms the seal between the one side of the consumer chamber, control chamber 8, and the other side of the pump connection chamber 7. On the other side, the pump connection chamber 7 is defined by the gasket 16, which defines the return flow chamber 20 on the other hand. The pump connection chamber 7 connects to pump connection channel P of the valve. The control chamber 8 connects to a consumer connection channel A of the valve.

The main piston 3 comprises a connection channel (center channel 21), which interconnects the return flow chamber 20 on the one hand and the control chamber 8 on the other. The plunger piston 4 extends with its free end into the consumer chamber, control chamber 8.

In the consumer chamber, control chamber 8, a sealing end 9 of the valve piston and the plunger piston 4 cooperate by the combination of an inner and an outer cone. In the illustrated embodiment, a seat end 10 of the main piston 3 is designed and constructed as the outer cone 9, and the facing end 10 of the plunger cone 4 as the inner cone 10. With that, it is possible to connect the control chamber 8 to the return flow chamber 20, or to separate it therefrom.

A plunger 11 of the plunger piston 4 cooperates with a plunger (not shown) of a magnet 12, which is energized by an electrical control connection 13. A main spring 18, which is supported on the front side of the pump connection chamber 7 in the region of seal 16, pushes the main piston 3 with its seat flange 6 against the seat 5. The cross sectional areas of the seat 5/6 and the end of main piston 3 at the other end of the pressure chamber 7 substantially correspond to each other, so that the main piston is balanced and pushed against the seat 5 only by the main spring 18.

The plunger piston can be biased by a safety spring 19 in the sense of rising from the seat end 9 of the main piston 3. To this end, the safety spring 19 is supported on the one hand on the inner shoulder 5 of the cartridge and on the other hand on a shoulder of the plunger piston 4.

In operation, the pressure chamber 7 is closed in the idle state relative to the control chamber 8, in that the main spring 18 pushes the main piston 3 with its seat flange 6 against the seat 5. Since the plunger piston is not biased by the magnet plunger, the safety spring 19 pushes the plunger piston 4 against the front side of control chamber 8 or against a stop of the magnet plunger (not shown). The control chamber 8 connects via the center channel 21 to the return flow chamber 20, and is therefore relieved from pressure. Thus, the main valve is in its initial position.

Figure 3:
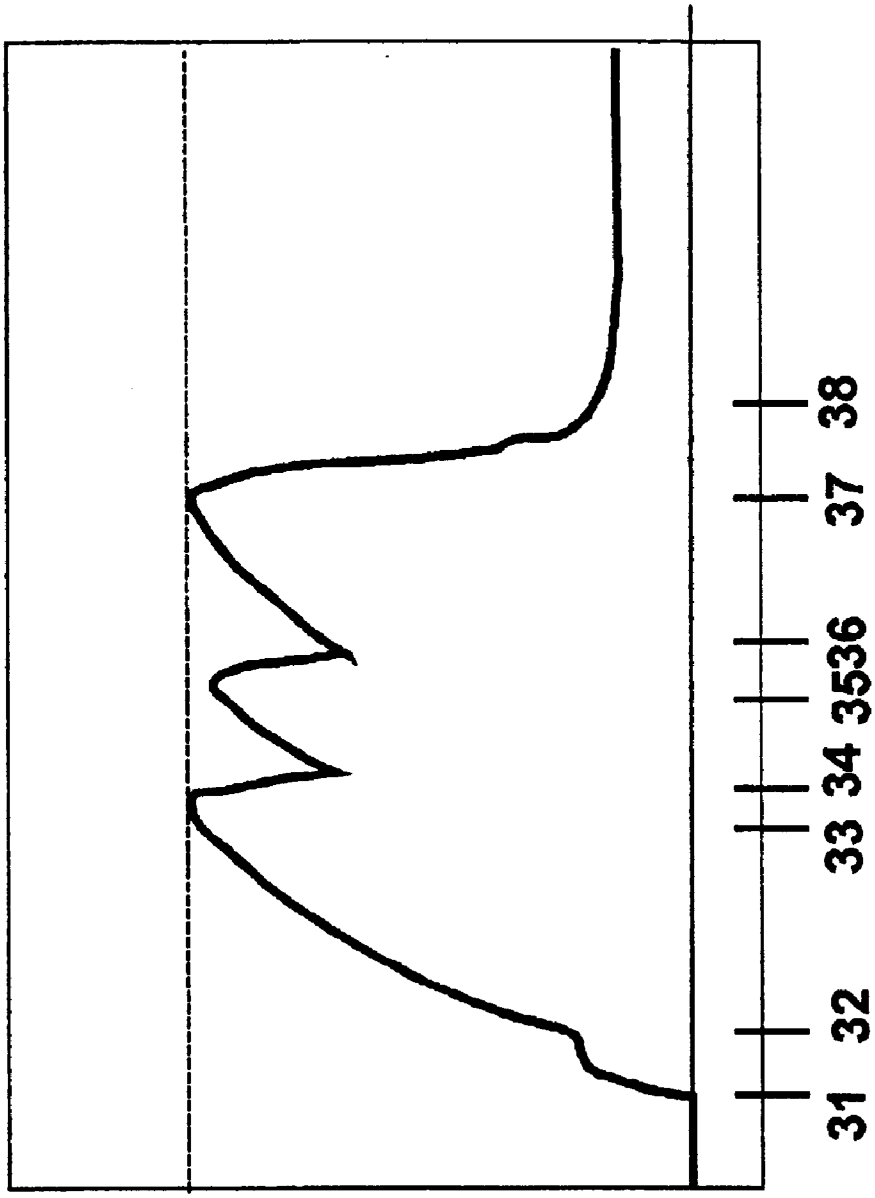
FIG. 3 shows the power input during the switching of the servo valve.

When the magnet 12 is energized (FIG. 3, point 31), the magnet starts to draw a current, which increases considerably when the spring force of the safety spring is overcome (point 32) and, thereafter, somewhat less considerably, until a contact is made with the seat end of the main piston 3. In this process, the current reaches a first peak (point 33). When the control chamber is closed toward the return flow chamber, in that the plunger piston with its seat end 10 contacts the sealing end 9 of the main piston, the current drops significantly (point 34).

This causes the main piston 3 to move now against the main spring 18. As a result, the current increases again and reaches a second peak (point 35), when the seat 5/6 starts to open. As soon as the main piston 3 moves against its stops 24 on the front side of the return flow chamber 20, the current drops one more time considerably (point 36). The current is now increased one more time to a value, which substantially corresponds to the highest of the foregoing values (point 37). This ensures that the main piston has safely reached its second switch position. In the second switch position, the control chamber is connected with the pressure chamber and closed toward the return flow chamber. With that, the slide of the valve is actuated and adjusted by the control pressure of the pressure chamber. The current is now lowered to a holding current (effective point 38), which generates by experience an adequate magnetic counterforce to the force of the main spring 18.

It is thus accomplished that the magnet is only little loaded during the holding time, in which it operates against the force of the main spring, i.e., so little as has previously been determined to be adequate by calculation and test.

The control unit 25 comprises a memory, which stores limit values and limit ranges for one or more of the points 31–38, in particular, however, for the peak values. These limit values/limit ranges have previously been determined by test, and they produce the desired values and the permissible limits. This means that as long as the current occurring during the switching sequence does not exceed these limit values, one can assume that the valve and all its elements perform their operation in a proper manner. However, if the current exceeds maximum values or falls below minimum values, same will be a sign that the valve is defective, for example, it sticks because of chips, or leaks due to wear.

If the control unit finds in this manner that the actual values deviate from the stored desired values, or if it is found that the limit ranges are exceeded, an alarm signal will follow. In mining or in other largescale plants, it may be advantageous to signal this alarm signal to a central control station. For an optical monitoring of a hydraulic plant, however, it may however be advantageous, when the signal also appears on the valve, for example, in the form of a red light.

NOMENCLATURE

1 Valve housing, outer housing
2 Valve housing, cartridge
3 Main piston, valve piston
4 Plunger piston
5 Seat, inner shoulder
6 Seat flange
7 Pressure chamber, pump connection chamber
8 Consumer chamber, control chamber
9 Seat end, closing end
10 Seat end, inner cone
11 Plunger
12 Magnet
13 Control connection, electric
14 Servovalve
15 Main valve, electrohydraulic control valve
16 Gasket
17 Gasket
18 Main spring
19 Safety spring
20 Return flow chamber
21 Connection channel, center channel
22 Gaskets
23 Gaskets
24 Stops
25 Current control unit

What is claimed is:

1. A hydraulic multiway valve, comprising:

a housing defining a consumer chamber, a return flow chamber, and a pressure chamber positioned between the consumer chamber and the return flow chamber, and the housing further defining a pump channel open to the pressure chamber, a consumer channel open to the consumer chamber, and a reservoir channel for being open to the return flow chamber;

a main piston movably positioned in the housing, the main piston extending through the pressure chamber and having opposite ends respectively positioned in the consumer chamber and the return flow chamber, and the main piston defining a central channel that extends through the main piston and is open at the opposite ends of the main piston so that the consumer chamber and the return flow chamber are capable of being open to one another via the central channel while the central channel is open;

a spring biasing the main piston toward a closed position in which the pressure chamber is closed to the consumer chamber due to seating between a flange of the main piston and a seat of the housing that separates the pressure chamber from the consumer chamber;

a plunger piston positioned in the valve housing for coaxial movement relative to the main piston, the plunger piston comprises a seat end and is movable toward the main piston so that the seat end engages a predetermined one of the ends of the main piston to close the central channel, and the plunger piston is movable away from the main piston to an open position in which the central channel is open; and a magnet assembly for moving the plunger piston so that the seat end of the plunger piston moves into contact with the predetermined end of the main piston to close the central channel, and the magnet assembly is also for moving the plunger piston so that the force of the spring is overcome and the main piston is moved to an open position in which the pressure chamber is open to the consumer chamber due to unseating between the flange of the main piston and the seat of the housing;

wherein the end of the main piston that extends into the return flow chamber slidingly engages an interior surface of the housing that defines the return flow chamber so that a seal is provided between the return flow chamber and the pressure chamber, and the cross section of the end of the main piston that extends into the return flow chamber corresponds substantially to the size of a seat surface of the flange of the main piston so that the main piston is substantially balanced, when the pressure chamber is closed.

2. A hydraulic multiway valve according to claim 1, wherein the housing is an inner housing and further comprising an outer housing having a front side that mounts the magnet assembly, wherein the inner housing is removably positioned in the outer housing and oriented so that the consumer chamber is proximate the front side of the outer housing, wherein the inner housing has opposite ends with one of the ends proximate the consumer chamber and the opposite end supporting the spring, and wherein the plunger piston contacts structure selected from the group consisting of the front side of the outer housing and a portion of the magnet assembly while the plunger piston is in its open position.

3. A hydraulic multiway valve according to claim 2, wherein the inner housing is screwed into the outer housing.

4. A hydraulic multiway valve according to claim 1, further comprising a safety spring that pushes the plunger piston to its open position so that the central channel is open while the main piston is in its closed position.

5. A hydraulic multiway valve according to claim 1, wherein:

the housing has an inner circumference with an inner shoulder positioned between the pressure chamber and the consumer chamber, and the inner shoulder defines the seat of the valve housing in the shape of an inner cone;

the flange of the main piston is in the shape of an outer cone that engages the seat while the main piston is in its closed position so that the pump channel and the pressure chamber are closed with respect to the consumer chamber and the consumer channel; and the seat of the valve housing and the flange of the main piston cooperate in the closed position of the main piston so that the pump connection and the pressure chamber are closed to the consumer channel and the consumer chamber.

6. A hydraulic multiway valve according to claim 1, wherein the predetermined end of the main piston extends into the consumer chamber and is conical, and the seat end of the plunger piston that engages the predetermined end of the main piston for closing the central channel is in the form of an inner cone.

7. A hydraulic multiway valve according to claim 1, wherein the spring has opposite ends, and one of the ends of the spring is supported by the flange of the main piston and the other end of the spring is supported by an interior portion of the housing that defines the pressure chamber.

8. A hydraulic multiway valve according to claim 1, further comprising:

a stop to which the main piston is engaged while the main piston is in its open position; and a power control unit for measuring and evaluating the flow of power supplied to the magnet assembly in the furtherance of having the magnet assembly operate to move the plunger piston.

9. A hydraulic multiway valve, comprising:

a housing defining a consumer chamber, a return flow chamber, and a pressure chamber positioned between the consumer chamber and the return flow chamber, and the housing further defining a pump channel open to the pressure chamber, a consumer channel open to the consumer chamber, and a reservoir channel for being open to the return flow chamber;

a piston movably positioned in the housing;

a spring biasing the piston toward a position in which the pressure chamber is closed to the consumer chamber;

a magnet assembly for configuring the piston in a switch position in which the pressure chamber is open to the consumer chamber and the consumer chamber is closed to the return flow chamber;

a stop to which the piston is engaged while the piston is in the switch position; and a power control unit for measuring and evaluating the flow of power supplied to the magnet assembly;

wherein the power control unit measures the current flow of the magnet assembly while achieving the switch position and determines when the switch position is reached, and thereafter the power control unit increases the current supplied to the magnet assembly one more time substantially to the extent reached while achieving the switch position, and thereafter the power control unit decreases the current supplied to the magnet assembly to the extent necessary for holding the piston in the switch position.

10. A hydraulic multiway valve according to claim 9, wherein the piston moves to the switch position by passing through a plurality of successive switch stages, the power control unit measures the current flow of the magnet assembly while passing through the switch stages and determines when the piston reaches the last switch stage, upon determining that the last switch stage has been reached the power control unit increases the current supplied to the magnet assembly one more time substantially to the highest extent reached while passing through the switch stages, and thereafter the power control unit lowers the current supplied to the magnet assembly to the extent necessary for holding the piston at the last switch stage.

11. A hydraulic multiway valve according to claim 9, wherein the power control unit compares prominent points of the actual flow of power supplied to the magnet assembly, while achieving the switch position, to corresponding points of the desired flow of power, and the power control unit signals deviations between the prominent points of the actual flow of power supplied to the magnet assembly and corresponding points of the desired flow of power.

12. A hydraulic multiway valve according to claim 11, further comprising a signaling mechanism that is proximate the valve and for providing an optical or acoustical signal in response to the signaling of a deviation by the power control unit.

13. A hydraulic multiway valve according to claim 11, wherein the power control unit stores limit values that define the deviations that are to be signaled.

14. A hydraulic multiway valve according to claim 9, wherein the power control unit compares the actual flow of power supplied to the magnet assembly while achieving the switch position to the desired flow of power, and the power control unit signals deviations between the actual flow of power supplied to the magnet assembly and the desired flow of power.

15. A hydraulic multiway valve according to claim 14, further comprising a signaling mechanism that is proximate the valve and for providing an optical or acoustical signal in response to the signaling of a deviation by the power control unit.

16. A hydraulic multiway valve according to claim 14, wherein the power control unit stores limit values that define the deviations that are to be signaled.

* * * * *